(12) United States Patent
Admon et al.

(10) Patent No.: US 7,417,443 B2
(45) Date of Patent: Aug. 26, 2008

(54) DETERMINATION OF EFFECTIVE RESISTANCE BETWEEN A POWER SOURCING EQUIPMENT AND A POWERED DEVICE

(75) Inventors: Dan Admon, Kiryat Tivon (IL); Shimon Elkayam, Milton (GB)

(73) Assignee: Microsemi Corp. - Analog Mixed Signal Group, Ltd., Hod Hasharon (IL)

( * ) Notice: Subject to any disclaimer, the term of this patent is extended or adjusted under 35 U.S.C. 154(b) by 86 days.

(21) Appl. No.: 11/620,675

(22) Filed: Jan. 7, 2007
(Under 37 CFR 1.47)

(65) Prior Publication Data
US 2008/0164890 A1 Jul. 10, 2008

(51) Int. Cl.
*G01R 27/08* (2006.01)
(52) U.S. Cl. .................. 324/713; 324/522; 324/691
(58) Field of Classification Search .......... 324/713
See application file for complete search history.

(56) References Cited

U.S. PATENT DOCUMENTS

| | | | |
|---|---|---|---|
| 6,473,608 B1 | 10/2002 | Lehr et al. | |
| 6,643,566 B1 | 11/2003 | Lehr et al. | |
| 7,145,439 B2* | 12/2006 | Darshan et al. | 340/310.11 |
| 7,355,416 B1* | 4/2008 | Darshan | 324/713 |
| 2004/0158167 A1 | 8/2004 | Smith et al. | |
| 2006/0164108 A1* | 7/2006 | Herbold | 324/691 |
| 2006/0176044 A1 | 8/2006 | Binder et al. | |
| 2006/0181283 A1* | 8/2006 | Wajcer et al. | 324/539 |
| 2006/0244462 A1* | 11/2006 | McCosh et al. | 324/522 |
| 2007/0064819 A1* | 3/2007 | Langer | 375/257 |
| 2007/0064922 A1* | 3/2007 | Schindler | 379/395.01 |
| 2007/0263675 A1* | 11/2007 | Lum et al. | 370/910 |
| 2008/0129118 A1* | 6/2008 | Diab | 307/35 |
| 2008/0148081 A1* | 6/2008 | Diab et al. | 713/320 |

OTHER PUBLICATIONS

IEEE Standards—802.3af-2003, pp. 36-57 (sections 33.2.3.7-33.3.6.1), p. 94-96; p. 102, p. 115, published Jun. 18, 2003, New York.

* cited by examiner

*Primary Examiner*—Vincent Q. Nguyen
*Assistant Examiner*—Benjamin M Baldridge
(74) *Attorney, Agent, or Firm*—Simon Kahn

(57) ABSTRACT

A method of determining an effective resistance between a power sourcing equipment and a powered device, the powered device exhibiting an interface and an operational circuitry, the method comprising: prior to connecting power to the operational circuitry of the powered device, impressing two disparate current flow levels ($I_1$, $I_2$) between the power sourcing equipment and the powered device; measuring the voltage at the powered device interface ($V_{PD1}$, $V_{PD2}$) responsive to each of the impressed disparate current levels; measuring the voltage at the power sourcing equipment ($V_{PSE1}$, $V_{PSE2}$) responsive to each of the impressed disparate current levels; and determining the effective resistance between the power sourcing equipment and the powered device responsive to the $V_{PD1}$, $V_{PD2}$, $V_{PSE1}$, $V_{PSE2}$, $I_1$ and $I_2$.

39 Claims, 7 Drawing Sheets

DETERMINATION OF EFFECTIVE RESISTANCE BETWEEN A POWER SOURCING EQUIPMENT AND A POWERED DEVICE

BACKGROUND OF THE INVENTION

The invention relates generally to the field of power over local area networks, particularly Ethernet based networks, and more particularly to a method of determining the effective resistance between a power sourcing equipment and a powered device.

The growth of local and wide area networks based on Ethernet technology has been an important driver for cabling offices and homes with structured cabling systems having multiple twisted wire pairs. The structured cable is also known herein as communication cabling and typically comprises four twisted wire pairs. In certain networks only two twisted wire pairs are used for communication, with the other set of two twisted wire pairs being known as spare pairs. In other networks all four twisted wire pairs are used for communication. The ubiquitous local area network, and the equipment which operates thereon, has led to a situation where there is often a need to attach a network operated device for which power is to be advantageously supplied by the network over the network wiring. Supplying power over the network wiring has many advantages including, but not limited to: reduced cost of installation; centralized power and power back-up; and centralized security and management.

Several patents addressed to the issue of supplying power to a PD over an Ethernet based network exist including: U.S. Pat. No. 6,473,608 issued Oct. 29, 2002 to Lehr et al.; and U.S. Pat. No. 6,643,566 issued Nov. 4, 2003 to Lehr et al.; the contents of all of which are incorporated herein by reference.

The IEEE 802.3af-2003 standard, whose contents are incorporated herein by reference, is addressed to powering remote devices over an Ethernet based network. The above standard is limited to a powered device (PD) having a maximum power requirement during operation of 12.95 watts. Power can be delivered to the PD either directly from the switch/hub, known as an endpoint power sourcing equipment (PSE), or alternatively via a midspan PSE. In either case power is delivered over a set of two twisted pairs. The above mentioned standard further prescribes a method of classification having a total of 5 power levels of which classes 0, 3 and 4 result in a maximum power level of 15.4 Watts at the PSE which is equivalent, in the worst case, to the aforementioned 12.95 watt limit.

The actual difference between the power level drawn from the PSE and the power level received at the PD is primarily a function of the power lost in the cable. The power required at the PSE to support a particular requested maximum power at the PD is thus equal to the requested maximum PD power plus any losses due to the effective resistance between the PSE and the PD. A maximum cable length of 100 meters is specified, and the voltage supplied by the PSE may range from a minimum of 44 volts to a maximum of 57 volts as measured at the PSE output. Thus, the amount of power lost in the cable may vary significantly depending on actual cable length and actual voltage.

The total amount of power available in a system supporting a plurality of PDs is often limited to less than 15.4 watts times the number of PDs attached. Thus, it is important to manage the power allocated to each PD so that the total power drawn does not exceed the power available from the power supply. In the event power is allocated according to classification, a measure of the effective resistance between the PSE and the PD, which is a metric of the power loss in the cable, would thus give a more accurate allocation of power per PSE port, since the power lost in each cable would be determined and not reserved for a worst case scenario. Thus, in the event of an effective resistance lower than the worst case effective resistance, a PD exhibiting a maximum power requirement of 12.95 watt may be supported with an allocation of power less than 15.4 watts. In the absence of a determination of the effective resistance, a worst case effective resistance is utilized, thereby leading to wasted power.

U.S. Pat. No. 7,145,439 issued Dec. 5, 2006 to Darshan et al., the entire contents of which is incorporated herein by reference, is addressed to a method for communicating multi-bit data from a PD interface associated with a PD to a PSE, the method comprising: sensing a voltage level indicative of remote powering over the communication cabling; and prior to connecting power to operational circuitry of the PD, transmitting multi-bit information responsive to the sensed voltage level from the PD interface to the PSE over communication cabling. In one embodiment the multi-bit information is transmitted by modulating a current flow between the PSE and the PD by impressing at least two current levels. Unfortunately, no means of determining the effective resistance between the PSE and the PD is provided.

There is thus a long felt need for a method of determining the effective resistance between the PSE and the PD, the effective resistance being primarily a function of cable quality and cable length.

SUMMARY OF THE INVENTION

Accordingly, it is a principal object of the present invention to overcome the disadvantages of prior art by providing a method for determining the effective resistance between the PSE and the PD, the method comprising: impressing a plurality of disparate current flow levels between the PSE and the PD prior to connecting power to PD operational circuitry; measuring the voltage at the PD interface at each of the plurality of impressed current flow levels; measuring the voltage at the PSE at each of the plurality of impressed current flow levels; and determining the effective resistance responsive to the plurality of voltage measurements at the PD, the plurality of voltage measurements at the PSE and the current flow levels.

Preferably the current flow levels are measured, and the measured current flow levels are utilized in determining the effective resistance. Preferably, the plurality of current flow levels are associated with PD-PSE communication.

Advantageously, determining the effective resistance of the cable and connections between the PSE and the PD allows for better allocation of power, since the actual power to be allocated to the PSE in order to support the PD classification power is more accurately determined.

The invention provides for a method of determining an effective resistance between a power sourcing equipment and a powered device, the powered device exhibiting an interface and an operational circuitry, the method comprising: prior to connecting power to the operational circuitry of the powered device, impressing two disparate current flow levels ($I_1$, $I_2$) between the power sourcing equipment and the powered device; measuring the voltage at the powered device interface ($V_{PD1}$, $V_{PD2}$) responsive to each of the impressed disparate current levels; measuring the voltage at the power sourcing equipment ($V_{PSE1}$, $V_{PSE2}$) responsive to each of the impressed disparate current levels; and determining the effective resistance between the power sourcing equipment and the powered device responsive to the $V_{PD1}$, $P_{PD2}$, $V_{PSE1}$, $V_{PSE2}$, $I_1$ and $I_2$.

In one embodiment determining the effective resistance comprises: calculating the resistance as a result of: $((V_{PSE1}-V_{PSE2})-(V_{PD1}-V_{PD2}))/(I_1-I_2)$. In one further embodiment the method further comprises: measuring the current of each of the two disparate current levels, the $I_1$, $I_2$ being the measured currents.

In one embodiment the method further comprises: measuring the current of each of the two disparate current levels, the $I_1$, $I_2$ being the measured currents. In another embodiment the method further comprises transmitting the measured voltages at the powered device interface to the power sourcing equipment. Preferably the transmitting is prior to the connecting power to operational circuitry of the powered device, the transmitting comprising further impressing two disparate flow current levels between the power sourcing equipment and the powered device.

In one embodiment the method further comprises: sensing a voltage at the powered device interface indicative of remote powering over communication cabling, wherein the impressing is responsive to the sensing. In another embodiment the method further comprises: classifying the powered device; and allocating power to the powered device responsive to the determined effective resistance and the classifying.

In one embodiment the method further comprises allocating power to the powered device responsive to the determined effective resistance. In another embodiment the method further comprises allocating power to the powered device, the allocating power being a function of a power requested by the powered device less power lost due to the determined effective resistance.

Independently, the invention provides for a system for determining an effective resistance between a power sourcing equipment and a powered device, the system comprising: a first power sourcing equipment; a first voltage measuring means associated with the first power sourcing equipment; a control circuitry responsive to the first voltage measuring means; a powered device, comprising a powered device interface and a powered device operational circuitry, arranged to receive power from the first power sourcing equipment; a second voltage measuring means associated with the powered device interface; and a current level impresser associated with the powered device interface, the powered device interface being operable responsive to the second voltage measuring means to: prior to connecting power to the powered device operational circuitry, impress, via the current level impresser, two disparate current flow levels ($I_1$, $I_2$) between the first power sourcing equipment and the powered device interface; and measure, via the second voltage measuring means, the voltage at the powered device interface ($V_{PD1}$, $P_{PD2}$) responsive to the impressed two disparate current flow levels, the control circuitry being operable to: measure, via the first voltage measuring means, the voltage at the first power sourcing equipment ($V_{PSE1}$, $V_{PSE2}$) responsive to the impressed two disparate current levels; and determine the effective resistance between the first power sourcing equipment and the powered device interface responsive to the $V_{PD1}$, $P_{PD2}$, $V_{PSE1}$, $V_{PSE2}$, $I_1$ and $I_2$.

In one embodiment the determined effective resistance is a function of: $((V_{PSE1}-V_{PSE2})-(V_{PD1}-V_{PD2}))/(I_1-I_2)$. In another embodiment the system further comprises a current measuring means, the $I_1$, $I_2$ being determined by the current measuring means.

In one embodiment the powered device interface further comprises a transmitter, the current level impresser being associated with the transmitter. Preferably, the powered device interface is further operable to transmit the measured voltages, via the transmitter, to the power sourcing equipment.

In one embodiment the current level impresser comprises one of a variable current source, a variable impedance, a switched impedance and a controllable current source. In another embodiment the powered device interface is further operable to transmit the measured voltages to the power sourcing equipment.

In one embodiment the powered device interface is further operable to transmit the measured voltages to the control circuitry. In another embodiment the system further comprises: a data path between the powered device interface and the powered device operational circuitry, the powered device interface being further operable to communicate the measured $V_{PD1}$, $V_{PD2}$ to the power device operational circuitry. Preferably, the powered device operational circuitry is further operable to transmit the communicated $V_{PD1}$, $V_{PD2}$ to the control circuitry.

In one embodiment the control circuitry further comprises a classification functionality operable to determine a requested power from the powered device interface. In one further embodiment the system further comprises: a master controller; and at least one second power sourcing equipment, each of the at least one second power sourcing equipment comprising a control circuitry, each of the control circuitry being responsive to the master controller. In a yet further embodiment the master controller is operable to allocate power to the first powered device responsive to the determined effective resistance and the determined requested power.

In one embodiment the system further comprises: a communication cabling connecting the first power sourcing equipment and the powered device, wherein the powered device arranged to receive power from the first power sourcing equipment receives the power via the communication cabling. In another embodiment the powered device interface is further operable to: sense a voltage, via the second voltage measuring means, of remote powering from the first power sourcing equipment, wherein the impressed two disparate current flow levels is responsive to the sensed voltage. In yet another embodiment the powered device further comprises an isolating switch responsive to the powered device interface, the isolating switch being arranged to switchably connect power to the powered device operational circuitry responsive to the powered device interface.

Independently the invention provides for a powered device interface operable in cooperation with a power sourcing equipment to determine an effective resistance there between, the powered device interface comprising: a control circuitry; a voltage measuring means in communication with the control circuitry; a current level impresser responsive to the control circuitry; and an isolating switch control means responsive to the control circuitry, the control circuitry being operable to: impress, via the current level impresser, two disparate current flow levels ($I_1$, $I_2$); measure, via the second voltage measuring means, the voltage at the powered device interface responsive to the impressed two disparate current flow levels; and subsequent to the sourcing two disparate current flow levels, operate the isolating switch control means to connect power to associated powered device operational circuitry.

In one embodiment the control circuitry is further operable to transmit the measured voltages. In another embodiment the powered device interface further comprises a transmitter responsive to the control circuitry, the control circuitry being operable to transmit the measured voltages, via the transmitter, to the power sourcing equipment. Preferably, the current level impresser is associated with the transmitter. In yet another embodiment the current level impresser comprises one of a variable current source, a variable impedance, a switched impedance and a controllable current source.

Independently the invention provides for a powered device operable in cooperation with a power sourcing equipment to determine an effective resistance there between, the powered device comprising: a powered device interface; a powered device operational circuitry; a voltage measuring means associated with the powered device interface; a current level impresser associated with the powered device interface; and an isolating switch responsive to the powered device interface, the powered device interface being operable to: to impress via the current level impresser, prior to connecting power to the powered device operational circuitry via the isolating switch, two disparate current flow levels ($I_1$, $I_2$); and measure, via the second voltage measuring means, voltages at the powered device interface responsive to the impressed two disparate current flow levels.

In one embodiment the powered device interface is further operable to transmit the measured voltages. In another embodiment the powered device further comprises a transmitter associated with the powered interface, the powered device interface being operable to transmit the measured voltages via the transmitter, to the power sourcing equipment. Preferably the current level impresser is associated with the transmitter.

In one embodiment the current level impresser comprises one of a variable current source, a variable impedance, a switched impedance and a controllable current source. In another embodiment the powered device further comprises a data path between the powered device interface and the powered device operational circuitry, the powered device interface being further operable to communicate the measured $V_{PD1}$, $V_{PD2}$ to the power device operational circuitry. In one further preferred embodiment the power device operational circuitry is operable to transmit the communicated $V_{PD1}$, $V_{PD2}$.

Independently the invention provides for a power sourcing equipment for determining an effective resistance between the power sourcing equipment and a powered device connected thereto, comprising: a control circuitry; a voltage measuring means arranged to measure a port voltage of the power sourcing equipment and in communication with the control circuitry; and a current measuring means arranged to measure a current flowing between the power sourcing equipment via the port to the powered device, the control circuitry being operable to: supply an operating voltage to the powered device via the port; detect, via the current measuring means two disparate current flow levels ($I_1$, $I_2$) between the power sourcing equipment via the port and the powered device responsive to the supplied operating voltage; receive an indication of the voltage at the powered device ($V_{PD1}$, $V_{PD2}$) responsive to the two disparate current flow levels; measure, via the voltage measuring means, the port voltage of the power sourcing equipment ($V_{PSE1}$, $V_{PSE2}$) responsive to the detected two disparate current levels; and determine the effective resistance between the power sourcing equipment and the powered device responsive to the responsive to the $V_{PD1}$, $V_{PD2}$, $V_{PSE1}$, $V_{PSE2}$, $I_1$ and $I_2$.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding sections or elements throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

DETAILED DESCRIPTION OF THE PREFERRED EMBODIMENTS

Figure 1A:
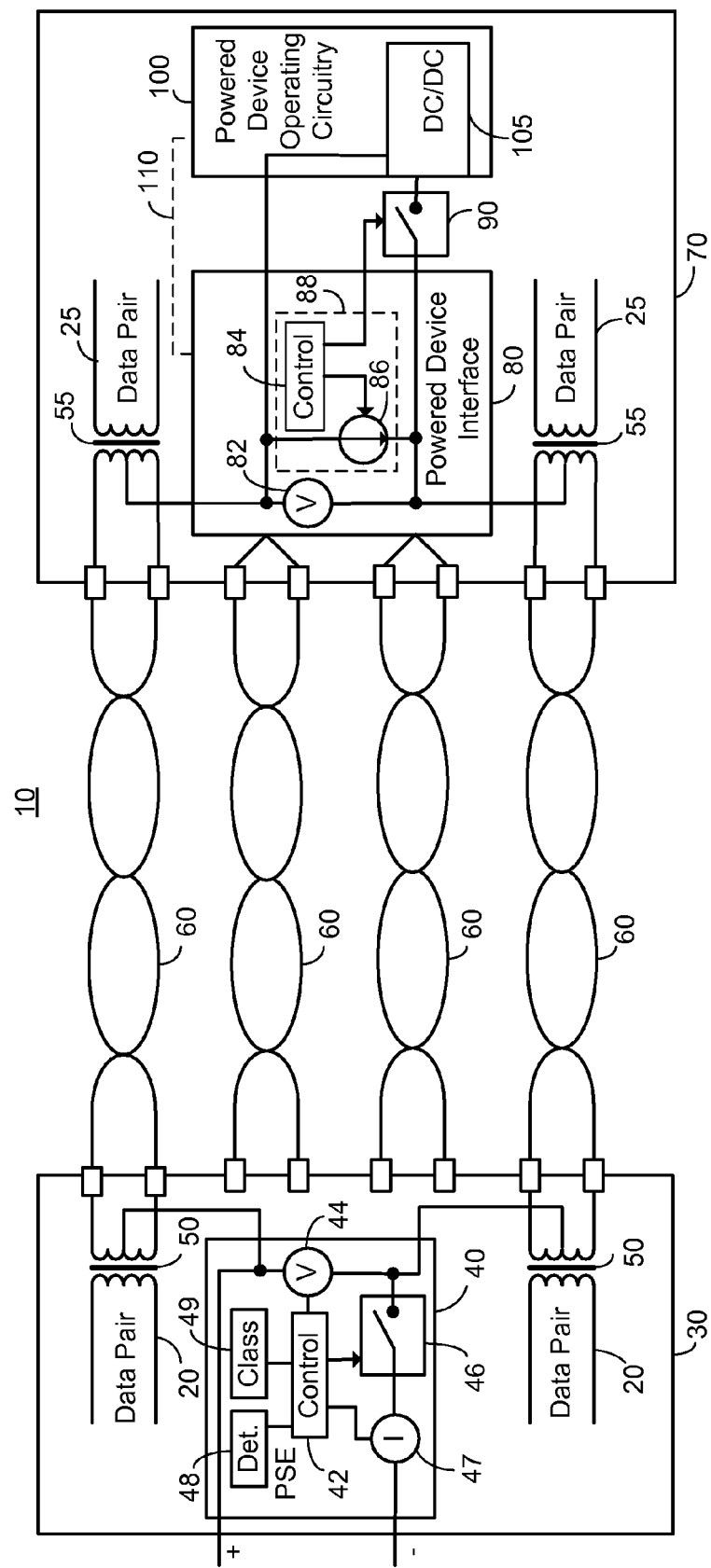
FIG. 1A illustrates a high level block diagram of a first alternative network configuration for remote powering from an endpoint PSE in accordance with a principle of the current invention.

The present embodiments enable a method for determining the effective resistance between the PSE and the PD, the method comprising: impressing a plurality of disparate current flow levels between the PSE and the PD prior to connecting power to PD operational circuitry; measuring the voltage at the PD interface at each of the plurality of impressed current flow levels; measuring the voltage at the PSE at each of the plurality of impressed current flow levels; and determining the effective resistance responsive to the plurality of voltage measurements at the PD, the plurality of voltage measurements at the PSE and the current flow levels.

Preferably the current flow levels are measured, and the measured current flow levels are utilized in determining the effective resistance. Preferably, the plurality of current flow levels are associated with PD-PSE communication.

Advantageously, determining the effective resistance of the cable and connections between the PSE and the PD allows for better allocation of power, since the actual power to be allocated to the PSE in order to support the PD classification power is more accurately determined.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

The invention is being described as an Ethernet based network, with a powered device being connected thereto. It is to be understood that the powered device is preferably an IEEE 802.3 compliant device preferably employing a 10Base-T, 100Base-T or 1000Base-T connection.

FIG. 1A illustrates a high level block diagram of a first alternative network configuration 10 for remote powering from an endpoint PSE in accordance with a principle of the current invention. Network configuration 10 comprises: a switch/hub equipment 30 comprising a first and a second data pair 20, a PSE 40 comprising a control circuitry 42, a voltage measuring means 44, an electronically controlled switch 46, a current measuring means 47, a detection functionality 48 and a classification functionality 49, and a first and a second data transformer 50; a first, a second, a third and a fourth twisted pair connection 60; and a powered end station 70 comprising a PD interface 80, a first and a second data transformer 55, a first and a second data pair 25, an isolating switch 90, and a PD operating circuitry 100 comprising a DC/DC converter 105. PD interface 80 comprises a voltage measuring means 82, a PD interface control circuitry 84 and a current level impresser 86 illustrated as a variable current source. Optionally, PD interface control circuitry 84 and current level impresser 86 constitute a transmitter 88. Powered end station 70 is alternatively denoted PD 70.

A positive power source lead is connected to a first input of voltage measuring means 44 and the center tap of the secondary of first data transformer 50. A negative power source lead is connected to a first end of current measuring means 47, and a second end of current measuring means 47 is connected to a first port of electronically controlled switch 46. A second port of electronically controlled switch 46 is connected to a return input of voltage measuring means 44 and the center tap of the secondary of second data transformer 50. A first output of control circuitry 42 is connected to the control port of electronically controlled switch 46, the output of current measuring means 47 is connected to an input of control circuitry 42 and the output of voltage measuring means 44 is connected to an input of control circuitry 42. Each of detection functionality 48 and classification functionality 49 are in communication with control circuitry 42. The primary of first and second data transformers 50 are each connected to communication devices, represented by first and second data pairs 20. The output leads of the secondary of first and second data transformers 50 are each connected to a first end of first and second twisted pair connections 60, respectively. The second end of first and second twisted pair connections 60 are respectively connected to the primary of first and second data transformers 55 located within PD 70. The center tap of the primary of first data transformer 55 is connected, as the power input of PD interface 80, to a first end of voltage measuring means 82, a first end of current level impresser 86 and to the power input of PD operating circuitry 100 at DC/DC converter 105. The center tap of the primary of second data transformer 55 is connected, as the power return of PD interface 80, to a second end of voltage measuring means 82, a second end of current level impresser 86 and a first port of isolating switch 90. The control port of isolating switch 90 is connected to an output of PD interface control circuitry 84, and a second port of isolating switch 90 is connected to the power return of PD operating circuitry 100 at DC/DC converter 105. An optional data path 110 is provided between PD interface 80 and PD operating circuitry 100.

In a preferred embodiment first and second data transformers 55 are part of PD interface 80. Preferably PD interface 80 comprises a diode bridge (not shown) arranged to ensure proper operation of PD 70 irrespective of the polarity of the connection to PSE 40. The secondary of first and second data transformers 55 are connected to communication devices, represented by first and second data pairs 25, respectively.

In operation, control circuitry 42 of PSE 40 detects PD 70 via detection functionality 48, optionally classifies PD 70 via classification functionality 49, and if power is available, supplies power over first and second twisted pair connection 60 to PD 70, by closing electronically controlled switch 46, thus supplying both power and data over first and second twisted pair connections 60. Third and fourth twisted pair connections 60 are not utilized, and are thus available as spare connections. Third and fourth twisted pair connections 60 are shown connected to PD interface 80 in order to allow operation alternatively in a manner that will be described further hereinto below in relation to FIG. 1B over unused third and fourth twisted pair connections 60.

PD interface 80 functions to present a signature resistance (not shown) to PSE 40 thus enabling detection by detection functionality 48, optionally present a classification current in cooperation with classification functionality 49, and upon detection, via voltage measuring means 44, of a voltage indicative of remote powering from PSE 40, impress at least two disparate current flow levels, denoted $I_1$, $I_2$, between PSE 40 and PD 70 via current level impresser 86. In particular PD interface circuitry 84 operates current level impresser 86 to source disparate current levels thereby determining the current flow between PSE 40 and PD 70. Isolating switch 90 is not closed to prevent startup of DC/DC converter 105, and the associated current fluctuations. Current flow levels $I_1$, $I_2$ are termed disparate in that they are sufficiently different so as to generate measurably different voltages at PD interface 80, to be measured by voltage measuring means 82, and at PSE 40, to be measured by voltage measuring means 44. In one embodiment each of voltage measuring means 44 and 82 comprises an A/D converter and thus the current flow levels must be sufficiently different to create discernibly different readings. In one embodiment $I_1$ and $I_2$ are separated by about 10 mA.

PD interface 80 further measures the voltage at PD interface 80 responsive to each of current flow levels $I_1$, $I_2$, denoted respectively $V_{PD1}$, $V_{PD2}$, and transmits measurement readings $V_{PD1}$, $V_{PD2}$. In one embodiment measurement readings $V_{PD1}$, $V_{PD2}$ are transmitted to control circuitry 42 and in another embodiment the measurement readings $V_{PD1}$, $V_{PD2}$ are transmitted to one of a host (not shown) and a master control (not shown), as described further hereinto below. In one embodiment measurement readings $V_{PD1}$, $V_{PD2}$ are transmitted by optional transmitter 88, by impressing a plurality of current levels utilizing current impresser 86 as described in the above referenced U.S. Pat. No. 7,145,439 issued Dec. 5, 2006 to Darshan et al. In yet another embodiment, the measurement readings $V_{PD1}$, $V_{PD2}$ are sent via optional data path 110 to PD operating circuitry 100, and transmitted over the data network by PD operating circuitry 100, typically as a layer 2 transaction.

Control circuitry 42 of PSE 40 measures the voltage at PSE 40, preferably at the output port thereof, via voltage measuring means 44, responsive to each of current flow levels $I_1$, $I_2$, denoted respectively $V_{PSE1}$, $V_{PSE2}$. Optionally, control circuitry 42 of PSE 40 further measures the current flow levels $I_1$, $I_2$ via current measuring means 47. The effective resistance between PSE 40 and PD 70 is then determined as a function of $V_{PSE1}$, $V_{PSE2}$, $V_{PD1}$, $V_{PD2}$ and $I_1$, $I_2$. In one embodiment $I_1$, $I_2$ are predetermined values and in another embodiment, as described above, $I_1$, $I_2$ are measured values. In particular, preferably the effective resistance, denoted $R_{effective}$, is calculated as:

$$R_{effective} = ((V_{PSE1} - V_{PSE2}) - (V_{PD1} - V_{PD2}))/(I_1 - I_2) \qquad \text{Eq. 1}$$

The above has been described in an embodiment in which the effective resistance is calculated at PSE 40, however this is not meant to be limiting in any way. In another embodiment the effective resistance is calculated by a master controller (not shown), as will be described further hereinto below, or at a host (not shown) wherein all measurements are sent. In yet another embodiment $R_{effective}$ is calculated by PD operating circuitry 100, and the measurements of PSE 40 are sent to PD operating circuitry 100 over the data network.

In the event that $R_{effective}$ determined above is outside of a predetermined range, a fault condition may be flagged to a host for service personnel action. The above has been described in an embodiment in which two disparate current levels are impressed, however this is not meant to be limiting in any way. Three or more current levels may be utilized without exceeding the scope of the invention. After PD interface control circuitry 84 has completed impressing current levels $I_1$, $I_2$, and optionally transmitting $V_{PD1}$, $V_{PD2}$ by impressing current levels, PD interface control circuitry 84 closes isolating switch 90 thereby powering PD operating circuitry 100.

Figure 1B:
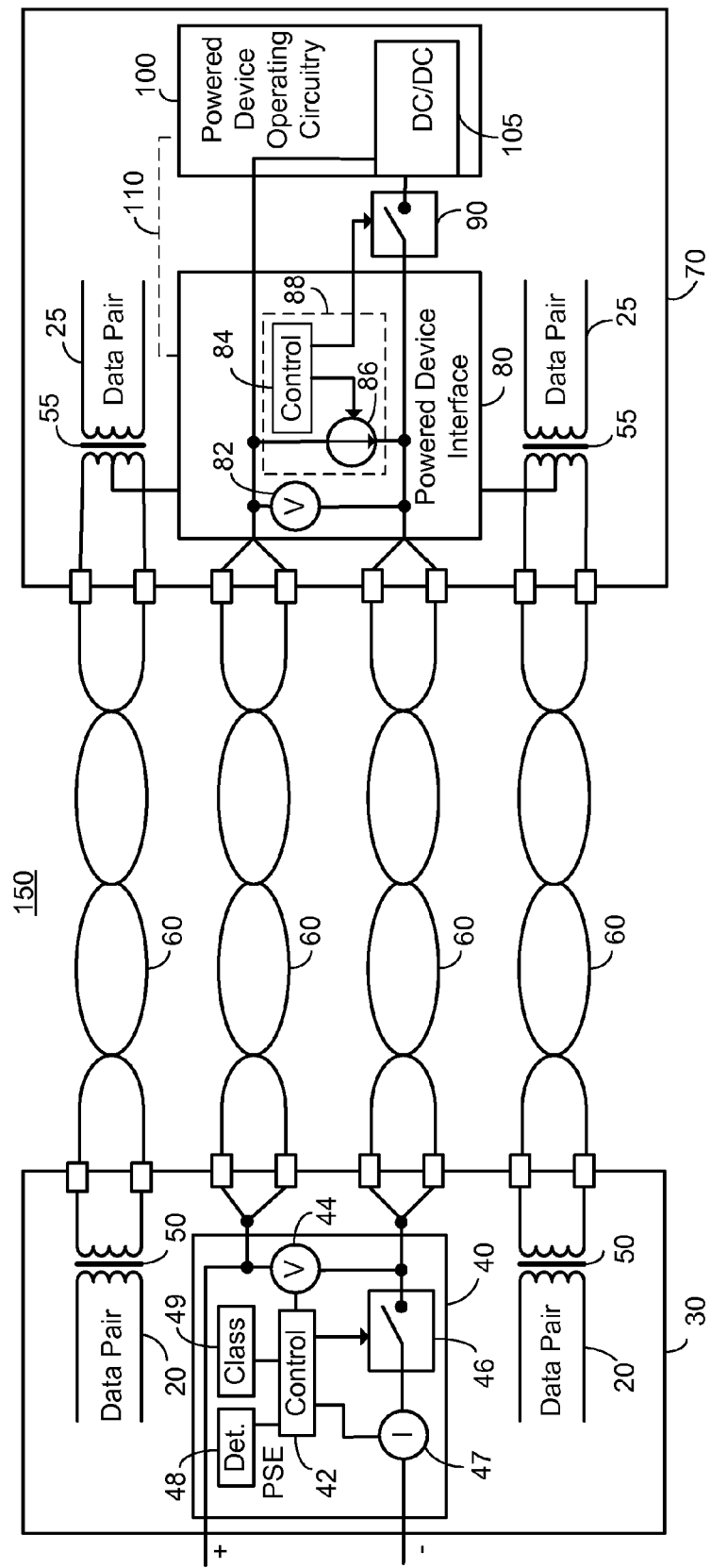
FIG. 1B illustrates a high level block diagram of a second alternative network configuration for remote powering from an endpoint PSE in accordance with a principle of the current invention.

FIG. 1B illustrates a high level block diagram of a second alternative network configuration 150 for remote powering from an endpoint PSE in accordance with a principle of the current invention. Network configuration 150 comprises: a switch/hub equipment 30 comprising a first and a second data pair 20, a PSE 40 comprising a control circuitry 42, a voltage measuring means 44, an electronically controlled switch 46, a current measuring means 47, a detection functionality 48 and a classification functionality 49, and a first and a second data transformer 50; a first, a second, a third and a fourth twisted pair connection 60; and a PD 70 comprising a PD interface 80, a first and a second data transformer 55, a first and a second data pair 25, an isolating switch 90, and a PD operating circuitry 100 comprising a DC/DC converter 105. PD interface 80 comprises a voltage measuring means 82, a PD interface control circuitry 84 and a current level impresser 86 illustrated as a variable current source. Optionally, PD interface control circuitry 84 and current level impresser 86 constitute a transmitter 88. Powered end station 70 is alternatively denoted PD 70.

A positive power source lead is connected to a first input of voltage measuring means 44 and to both leads of a first end of third twisted pair connection 60. A negative power source lead is connected to a first end of current measuring means 47, and a second end of current measuring means 47 is connected to a first port of electronically controlled switch 46. A second port of electronically controlled switch 46 is connected to a return input of voltage measuring means 44 and to both leads of a first end of fourth twisted pair connection 60. A first output of control circuitry 42 is connected to the control port of electronically controlled switch 46, the output of current measuring means 47 is connected to an input of control circuitry 42 and the output of voltage measuring means 44 is connected to an input of control circuitry 42. Each of detection functionality 48 and classification functionality 49 are in communication with control circuitry 42. The primary of first and second data transformers 50 are connected to communication devices, represented by first and second data pairs 20, respectively. The output leads of the secondary of first and second data transformers 50 are each connected to a first end of first and second twisted pair connections 60, respectively. The second end of first and second twisted pair connection 60 is connected to the primary of first and second data transformer 55, respectively, located within PD 70. The center tap of the primary of first and second data transformer 55 is connected to PD interface 80. The second end of both leads of third twisted pair connection 60 is connected, as the power input of PD interface 80, to a first end of voltage measuring means 82, a first end of current level impresser 86 and to the power input of PD operating circuitry 100 at DC/DC converter 105. The second end of both leads of fourth twisted pair connection 60 is connected, as the power return of PD interface 80, to a second end of voltage measuring means 82, a second end of current level impresser 86 and a first port of isolating switch 90. The control port of isolating switch 90 is connected to an output of PD interface control circuitry 84, and a second port of isolating switch 90 is connected to the power return of PD operating circuitry 100 at DC/DC converter 105. An optional data path 110 is provided between PD interface 80 and PD operating circuitry 100.

In a preferred embodiment, first and second data transformers 55 are part of PD interface 80. Preferably, PD interface 80 comprises a diode bridge 85 (not shown) arrange to ensure proper operation of PD 70 irrespective of the polarity of the connection to PSE 40. The secondary of first and second data transformers 55 are connected to communication devices, represented by first and second data pairs 25, respectively.

In operation, control circuitry 42 of PSE 40 detects PD 70 via detection functionality 48, optionally classifies PD 70 via classification functionality 49, and if power is available, supplies power over third and fourth twisted pair connections 60 to PD 70, with data being supplied over first and second twisted pair connections 60. Power and data are thus supplied over separate connections, and are not supplied over a single twisted pair connection. The center tap connection of first and second data transformer 55 is not utilized, but is shown connected in order to allow operation alternatively as described above in relation to network configuration 10 of FIG. 1A. Network configurations 10 and 150 thus allow for powering PD 70 by PSE 40 either over the set of twisted pair connections 60 utilized for data communications, or over the set of twisted pair connections 60 not utilized for data communications.

PD interface 80 functions to present a signature resistance (not shown) to PSE 40 for detection by detection functionality 48, optionally present a classification current in cooperation with classification functionality 49, and upon detection of a voltage, via voltage measuring means 82, indicative of remote powering from PSE 40, impresses at least two disparate current flow levels, denoted $I_1$, $I_2$, between PSE 40 and PD 70 via current level impresser 86. In particular, PD interface circuitry 84 operates current level impresser 86 to source disparate current levels thereby determining the current flow between PSE 40 and PD 70. Isolating switch 90 is not closed to prevent startup of DC/DC converter 105, and the associated current fluctuations. Current flow levels $I_1$, $I_2$ are termed disparate in that they are sufficiently different so as to generate measurably different voltages at PD interface 80, to be measured by voltage measuring means 82, and at PSE 40, to be measured by voltage measuring means 44. In one embodiment each of voltage measuring means 44 and 82 comprises an A/D converter and thus the current flow levels must be sufficiently different to create discernibly different readings. In one embodiment $I_1$ and $I_2$ are separated by about 10 mA.

PD interface 80 further measures the voltage at PD interface 80 responsive to each of current flow levels $I_1$, $I_2$, denoted respectively $V_{PD1}$, $V_{PD2}$, and transmits measurement readings $V_{PD1}$, $V_{PD2}$. In one embodiment the measurement readings $V_{PD1}$, $V_{PD2}$ are transmitted to control circuitry 42 and in another embodiment measurement readings $V_{PD1}$, $V_{PD2}$ are transmitted to one of a host (not shown) and a master control, as described further hereinto below. In one embodiment measurement readings $V_{PD1}$, $V_{PD2}$ are transmitted by optional transmitter 88, by impressing a plurality of current levels as described in the above referenced U.S. Pat. No. 7,145,439 issued Dec. 5, 2006 to Darshan et al. In yet another embodiment, measurement readings $V_{PD1}$, $V_{PD2}$ are sent via optional data path 110 to PD operating circuitry 100, and transmitted over the data network by PD operating circuitry 100, typically as a layer 2 transaction.

Control circuitry 42 of PSE 40 measures the voltage at PSE 40, preferably at the output port thereof, via voltage measuring means 44, responsive to each of current flow levels $I_1$, $I_2$, denoted respectively $V_{PSE1}$, $V_{PSE2}$. Optionally, control circuitry 42 of PSE 40 further measures the current flow levels $I_1$, $I_2$ via current measuring means 47. The effective resistance between PSE 40 and PD 70, denoted $R_{effective}$, is then determined as a function of $V_{PSE1}$, $V_{PSE2}$, $V_{PD1}$, $V_{PD2}$ and $I_1$, $I_2$. In one embodiment $I_1$, $I_2$ are predetermined values and in another embodiment, as described above, $I_1$, $I_2$ are measured values. Preferably, $R_{effective}$ is calculated as described in Eq. 1, above.

The above has been described in an embodiment in which the effective resistance is calculated at PSE 40, however this is not meant to be limiting in any way. In another embodiment the effective resistance is calculated by a master controller (not shown), as will be described further hereinto below, or at a host (not shown) wherein all measurements are sent. In yet another embodiment the effective resistance is calculated by PD operating circuitry 100, and the measurements of PSE 40 are sent to PD operating circuitry 100 over the data network.

In the event that $R_{effective}$ determined above is outside of a predetermined range, a fault condition may be flagged to a host for service personnel action. The above has been described in an embodiment in which two disparate current levels are impressed, however this is not meant to be limiting in any way. Three or more current levels may be utilized without exceeding the scope of the invention. After PD interface control circuitry 84 has completed impressing $I_1$, $I_2$, and optionally transmitting $V_{PD1}$, $V_{PD2}$ by impressing current levels, PD interface control circuitry 84 closes isolating switch 90 thereby powering PD operating circuitry 100.

Figure 1C:
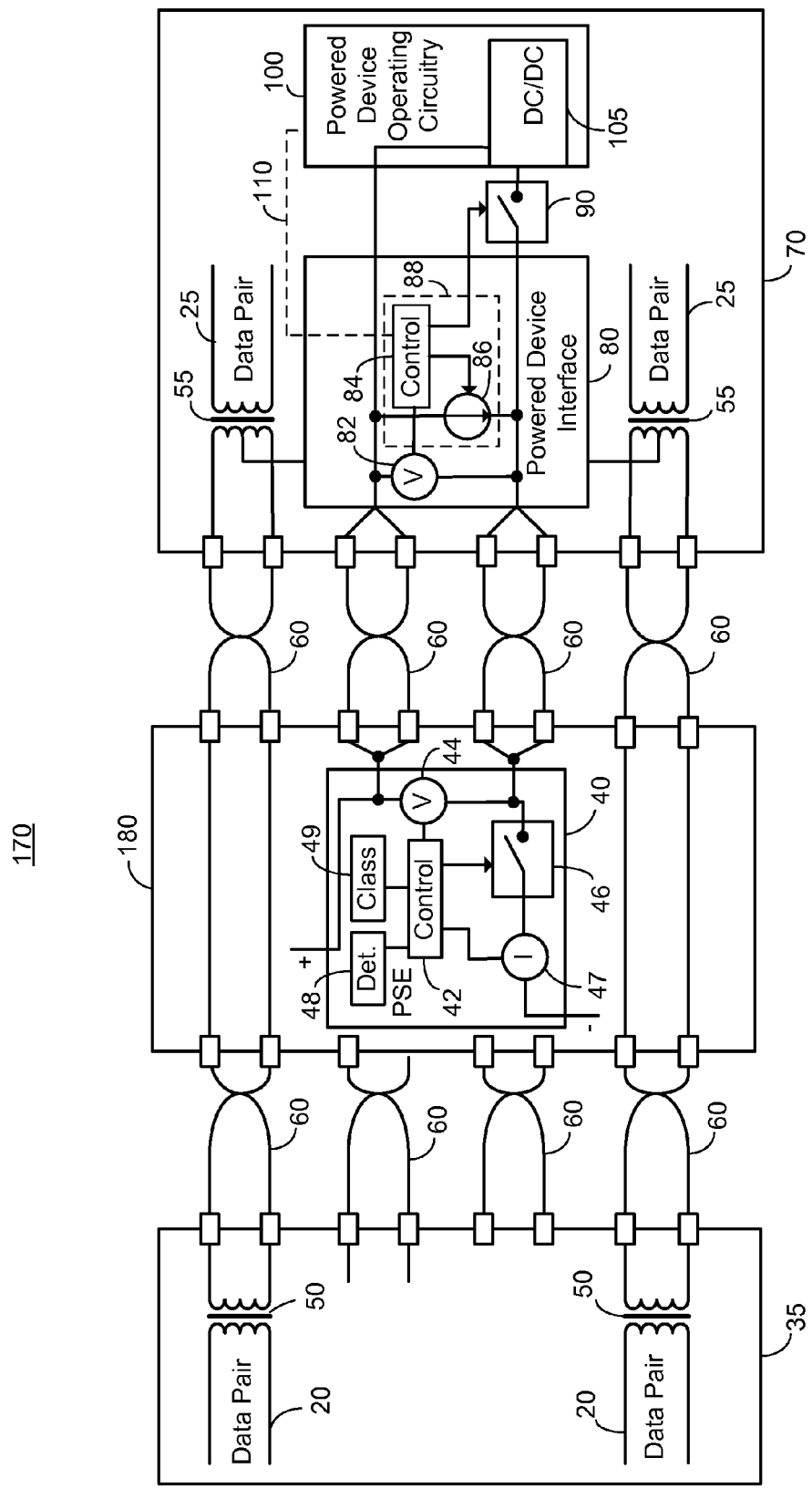
FIG. 1C illustrates a high level block diagram of an alternative network configuration for remote powering from a midspan PSE in accordance with a principle of the current invention.

FIG. 1C illustrates a high level block diagram of an alternative network configuration 170 for remote powering from a midspan power insertion equipment 180 in accordance with a principle of the current invention. Network configuration 170 comprises: a switch/hub equipment 35 comprising a first and a second data pair 20 and a first and a second data transformer 50; a first through eighth twisted pair connection 60; a PD 70 comprising a PD interface 80, a first and a second data transformer 55, a first and a second data pair 25, an isolating switch 90, and a PD operating circuitry 100 comprising a DC/DC converter 105; and a midspan power insertion equipment 180 comprising a PSE 40 comprising a control circuitry 42, a voltage measuring means 44, an electronically controlled switch 46, a current measuring means 47, a detection functionality 48 and a classification functionality 49. PD interface 80 comprises a voltage measuring means 82, a PD interface control circuitry 84 and a current level impresser 86 illustrated as a variable current source. Optionally, PD interface control circuitry 84 and current level impresser 86 constitute a transmitter 88. Powered end station 70 is alternatively denoted PD 70.

The primary of first and second data transformers 50 are connected, respectively, to communication devices represented by first and second data pairs 20. The output leads of the secondary of first and second data transformers 50 are connected, respectively, to a first end of first and second twisted pair connections 60. The second end of first and second twisted pair connections 60 are connected as a straight through connection through midspan power insertion equipment 180 to a first end of fifth and sixth twisted pair connections 60, respectively. A second end of fifth and sixth twisted pair connections 60 are connected to the primary of first and second data transformer 55, respectively, located within PD 70. Third and fourth twisted pair connections 60 are shown connected between switch/hub 35 and midspan power insertion equipment 180, however no internal connection to either third of fourth twisted pair connection is made.

A positive power source lead is connected to a first input of voltage measuring means 44 and to both leads of a first end of seventh twisted pair connection 60. A negative power source lead is connected to a first end of current measuring means 47, and a second end of current measuring means 47 is connected to a first port of electronically controlled switch 46. A second port of electronically controlled switch 46 is connected to a return input of voltage measuring means 44 and to both leads of a first end of eighth twisted pair connection 60. A first output of control circuitry 42 is connected to the control port of electronically controlled switch 46, the output of current measuring means 47 is connected to an input of control circuitry 42 and the output of voltage measuring means 44 is connected to an input of control circuitry 42. Each of detection functionality 48 and classification functionality 49 are in communication with control circuitry 42. The second end of both leads of seventh twisted pair connection 60 is connected, as the power input of PD interface 80, to a first end of voltage measuring means 82, a first end of current level impresser 86 and to the power input of PD operating circuitry 100 at DC/DC converter 105. The second end of both leads of eighth twisted pair connection 60 is connected, as the power return of PD interface 80, to a second end of voltage measuring means 82, a second end of current level impresser 86 and a first port of isolating switch 90. The control port of isolating switch 90 is connected to an output of PD interface control circuitry 84, and a second port of isolating switch 90 is connected to the power return of PD operating circuitry 100 at DC/DC converter 105. An optional data path 110 is provided between PD interface 80 and PD operating circuitry 100.

In a preferred embodiment first and second data transformers 55 are part of PD interface 80. Preferably PD interface 80 comprises a diode bridge 85 (not shown) arrange to ensure proper operation of PD 70 irrespective of the polarity of the connection to PSE 40. The secondary of first and second data transformers 55 are connected to communication devices, represented by first and second data pairs 25, respectively.

In operation, control circuitry 42 of PSE 40 detects PD 70 via detection functionality 48, optionally classifies PD 70 via classification functionality 49, and if power is available, supplies power over seventh and eighth twisted pair connections 60 to PD 70, with data being supplied over first, second, fifth and sixth twisted pair connections 60. Power and data are thus supplied over separate connections, and are not supplied over a single twisted pair connection. The center tap connection of first and second data transformer 55 is not utilized, but is shown connected in order to allow operation alternatively as described above in relation to network configuration 10 of FIG. 1A.

PD interface 80 functions to present a signature resistance (not shown) to PSE 40 for detection by detection functionality 48, optionally present a classification current in cooperation with classification functionality 49, and upon detection of a voltage indicative of remote powering from PSE 40, impress at least two disparate current flow levels, denoted $I_1$, $I_2$, between PSE 40 and PD 70 via current level impresser 86. In particular PD interface circuitry 84 operates current level impresser 86 to source disparate current levels thereby determining the current flow between PSE 40 and PD 70. Isolating switch 90 is not closed to prevent startup of DC/DC converter 105, and the associated current fluctuations. Current flow levels $I_1$, $I_2$ are termed disparate in that they are sufficiently different so as to generate measurably different voltages at PD interface 80, to be measured by voltage measuring means 82, and at PSE 40, to be measured by voltage measuring means 44. In one embodiment each of voltage measuring means 44 and 82 comprises an A/D converter and thus the current flow levels must be sufficiently different to create discernibly different readings. In one embodiment $I_1$ and $I_2$ are separated by about 10 mA.

PD interface 80 further measures the voltage at PD interface 80 responsive to each of current flow levels $I_1$, $I_2$, denoted respectively $V_{PD1}$, $V_{PD2}$, and transmits measurement readings $V_{PD1}$, $V_{PD2}$. In one embodiment measurement readings $V_{PD1}$, $V_{PD2}$ are transmitted to control circuitry 42 and in another embodiment measurement readings $V_{PD1}$, $V_{PD2}$ are transmitted to one of a host (not shown) and a master control (not shown), as described further hereinto below. In one embodiment measurement readings $V_{PD1}$, $V_{PD2}$ are transmitted by optional transmitter 88, by impressing a plurality of current levels as described in the above referenced U.S. Pat. No. 7,145,439 issued Dec. 5, 2006 to Darshan et al. In yet another embodiment, the measurement readings $V_{PD1}$, $V_{PD2}$ are sent via optional data path 110 to PD operating circuitry 100, and transmitted over the data network by PD operating circuitry 100, typically as a layer 2 transaction.

Control circuitry 42 of PSE 40 measures the voltage at PSE 40, preferably at the output port thereof, via voltage measuring means 44, responsive to each of current flow levels $I_1$, $I_2$, denoted respectively $V_{PSE1}$, $V_{PSE2}$. Optionally, control circuitry 42 of PSE 40 further measures the current flow levels $I_1$, $I_2$ via current measuring means 47. The effective resistance between PSE 40 and PD 70, denoted $R_{effective}$, is then determined as a function of $V_{PSE1}$, $V_{PSE2}$, $V_{PD1}$, $V_{PD2}$ and $I_1$, $I_2$. In one embodiment $I_1$, $I_2$ are predetermined values and in another embodiment, as described above, $I_1$, $I_2$ are measured values. Preferably, $R_{effective}$ is calculated as described in Eq. 1, above.

The above has been described in an embodiment in which the effective resistance is calculated at PSE 40, however this is not meant to be limiting in any way. In another embodiment the effective resistance is calculated by a master controller (not shown), as will be described further hereinto below, or at a host (not shown) wherein all measurements are sent. In yet another embodiment the effective resistance is calculated by PD operating circuitry 100, and the measurements of PSE 40 are sent to PD operating circuitry 100 over the data network.

In the event that $R_{effective}$ determined above is outside of a predetermined range, a fault condition may be flagged to a host for service personnel action. The above has been described in an embodiment in which two disparate current levels are impressed, however this is not meant to be limiting in any way. Three or more current levels may be utilized without exceeding the scope of the invention. After PD interface control circuitry 84 has completed impressing current levels $I_1$, $I_2$, and optionally transmitting $V_{PD1}$, $V_{PD2}$ by impressing current levels, PD interface control circuitry 84 closes isolating switch 90 thereby powering PD operating circuitry 100.

Figure 2:
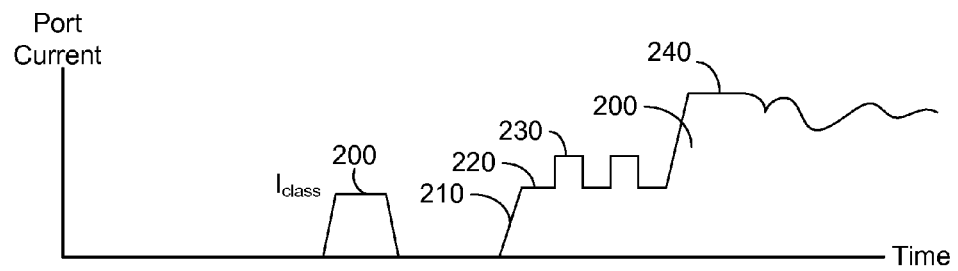
FIG. 2 illustrates a timing diagram of current flow between the PSE and PD, in accordance with a principle of the invention, exhibiting two impressed disparate current flow levels prior to connecting power to PD operational circuitry.

FIG. 2 illustrates a timing diagram of current flow between PSE 40 and PD 70 of any of FIGS. 1A-1C, in accordance with a principle of the invention, to impress two disparate current levels prior to connecting power to PD operational circuitry. The x-axis represents time and the y-axis represents current flow between PSE 40 and PD 70 in arbitrary units. Classification current waveform 200, representing a classification current value, denoted $I_{class}$, is presented responsive to a particular voltage output of classification functionality 49.

Responsive to a sensed operating voltage supplied from PSE 40, current waveform 200 exhibits a rising leading slope 210 as current begins to flow between PSE 40 and PD interface 80. In prior art systems, isolating switch 90 would be closed responsive to the sensed operating voltage thereby delivering power to DC/DC converter 105. In accordance with the principle of the subject invention, isolating switch 90 is not closed, but instead a first current flow level 220 and a second current flow level 230 are impressed upon the current flow between PSE 40 and PD interface 80. In one embodiment the two current flow levels represent multi-bit communication as described in the above referenced U.S. Pat. No. 7,145,439 issued Dec. 5, 2006 to Darshan et al.

After completion of any communication between PD interface 80 and PSE 40, or in the event that no communication occurs after impressing first current level 210 and second current level 220, isolating switch 90 is closed thereby supplying power to PD operating circuitry 100 and enabling the start up of DC/DC converter 105. Waveform 240 represents the operating condition of DC/DC converter 105 exhibiting a nominal value with momentary fluctuations. First and second current levels 210, 220 are preferably each impressed for a predetermined time period, thereby enabling acquisition by control circuitry 42. Preferably, first and second current levels 210, 220 are impressed repeatedly to ensure accurate measurement.

Preferably, first current flow level 220 and second current flow level 230 are disparate current levels being sufficiently different so as to enable determination of the effective resistance between PSE 40 and PD interface 80. In particular, in one embodiment first current flow level 220 represents approximately 10 mA and second current flow level 230 represents approximately 20 mA.

Figure 3A:
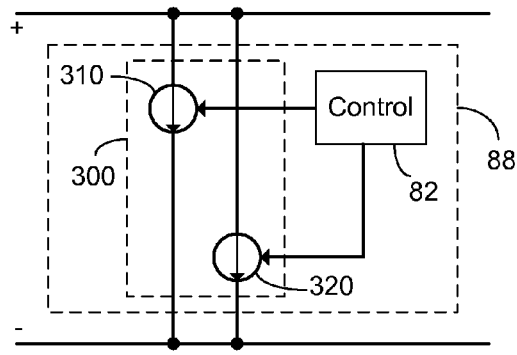
FIG. 3A illustrates an embodiment of a current level impresser of any of FIGS. 1A-1C comprising a plurality of controllable current sources in accordance with a principle of the invention.

FIG. 3A illustrates an embodiment of a current level impresser 300 of any of FIGS. 1A-1C, comprising a first controllable current source 310 and a second controllable current source 320, in accordance with a principle of the invention. FIG. 3A further exhibits a control circuitry 82 and an optional transmitter 88. Optional transmitter 88 comprises control circuitry 82 and controllable current sources 310, 320. Control circuitry 82 is connected to the control port of each of first controllable current source 310 and second controllable current source 320. First controllable current source 310 and second controllable current source 320 are arranged in parallel between the positive and negative supply rails of PD interface 80. In a preferred embodiment first controllable current source 310 and second controllable current source 320 are identically constituted with the exception of producing disparate current levels.

In operation, control circuitry 82 alternatively operates each of first controllable current source 310 and second controllable current source 320 to impress at least two disparate current flow levels between PSE 40 and PD interface 80. Optionally, transmitter 88 performs multi-bit data transmission from PD interface 80 to PSE 40 further utilizing first controllable current source 310 and second controllable current source 320 to impress at least two disparate current flow levels between PSE 40 and PD interface 80 prior to closing isolating switch 90 (not shown).

Figure 3B:
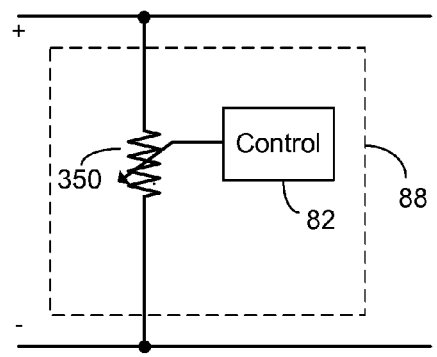
FIG. 3B illustrates an embodiment of a current level impresser of any of FIGS. 1A-1C comprising a variable impedance in accordance with a principle of the invention.

FIG. 3B illustrates an embodiment of a current level impresser 350 of any of FIGS. 1A-1C, constituted of a variable-impedance, in accordance with a principle of the invention. FIG. 3A further exhibits a control circuitry 82 and an optional transmitter 88 comprising control circuitry 82 and variable-impedance 350. Control circuitry 82 is connected to the control port of variable-impedance 350, and variable-impedance 350 is arranged between the positive and negative supply rails of PD interface 80.

In operation, control circuitry 82 adjusts variable-impedance 350 to exhibit a plurality of values thereby impressing at least two disparate current flow levels between PSE 40 and PD interface 80. Optionally, transmitter 88 performs multi-bit data transmission from PD interface 80 to PSE 40 further utilizing variable-impedance 350 to impress at least two disparate current flow levels between PSE 40 and PD interface 80 prior to closing isolating switch 90 (not shown).

Figure 3C:
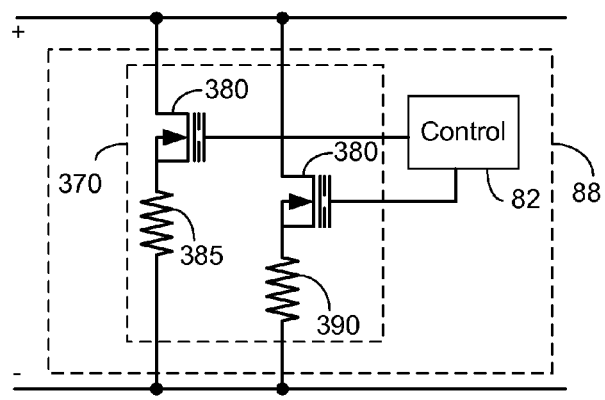
FIG. 3C illustrates an embodiment of a current level impresser of any of FIGS. 1A-1C comprising a plurality of switched impedances in accordance with a principle of the invention.

FIG. 3C illustrates an embodiment of a current level impresser 370 of any of FIGS. 1A-1C comprising a plurality of electronically controlled switches 380, a first impedance 385 and a second impedance 390 in accordance with a principle of the invention. First impedance 385 is connected in series with a first electronically controlled switch 380 between the positive and negative supply rails of PD interface 80. Second impedance 390 is connected in series with a second electronically controlled switch 380 between the positive and negative supply rails of PD interface 80. In a preferred embodiment, first impedance 385 and second impedance 390 are constituted of impedances selected to produce to disparate current levels when connected between positive and negative supply rails of PD interface 80 by the associated electronically controlled switch 380. FIG. 3C further exhibits a control circuitry 82 and an optional transmitter 88. The control port of each of first and second electronically controlled switch 380 is connected to a unique output of control circuitry 82. Optional transmitter 88 comprises control circuitry 82, first impedance 385, second impedance 390 and first and second electronically controlled switches 380.

In operation, control circuitry 82 alternatively operates each of first and second electronically controlled switches 380 to impress at least two disparate current flow levels between PSE 40 and PD interface 80 by alternatively connecting first impedance 385 and second impedance 390 across the positive and negative supply rails of PD interface 80. Optionally, transmitter 88 performs multi-bit data transmission from PD interface 80 to PSE 40 further utilizing first and second electronically controlled switches 380 in cooperation with first impedance 385 and second impedance 390 to impress at least two disparate current flow levels between PSE 40 and PD interface 80 prior to closing isolating switch 90 (not shown).

Figure 4:
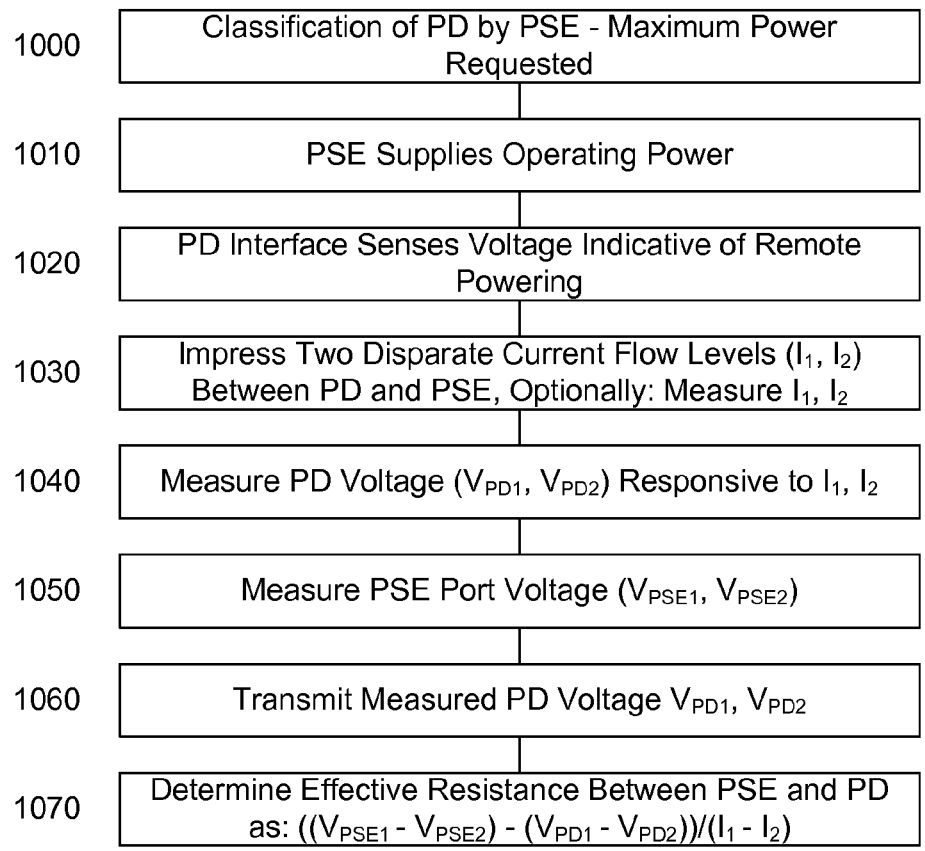
FIG. 4 illustrates a high level flow chart of the operation of any of the systems of FIGS. 1A-1C to determine the effective resistance between the PSE and the PD according to a principle of the current invention.

FIG. 4 illustrates a high level flow chart of the operation of any of systems 10,150, 170 of FIGS. 1A-1C to determine the effective resistance between PSE 40 and PD 70 according to a principle of the current invention. In stage 1000, PSE 40 classifies PD 70 via classification functionality 49. Classification of PD 70, in accordance with IEEE 802.3 af, determines the maximum requested power of PD 70. It is to be understood by those skilled in the art that prior to classification of stage 1000, detection of PD 70 is performed via detection functionality 48.

In stage 1010, PSE 40 supplies operating power, if available, to PD interface 80 over communication cabling 60 by closing electronically controlled switch 46. In stage 1020, control circuitry 84 of PD interface 80 senses voltage indicative of remote powering from PSE 40 via voltage measuring means 82. In stage 1030, control circuitry 84 impresses two disparate current flow levels, denoted $I_1$, $I_2$, between PD interface 80 and PSE 40. Optionally, control circuitry 42 of PSE 40 measures the actual current flow levels between PD interface 80 and PSE 40 via current measuring means 47.

In stage 1040, control circuitry 84 of PD interface 80 measures the PD voltage, denoted $V_{PD1}$, $V_{PD2}$, respectively, responsive to the two disparate current flow levels $I_1$, $I_2$. $V_{PD1}$, $V_{PD2}$ are measured via voltage measuring means 82. In stage 1050, the port voltage of PSE 40, responsive to the two disparate current flow levels $I_1$, $I_2$, and denoted $V_{PSE1}$, $V_{PSE2}$, respectively, are measured via voltage measuring means 44 of PSE 40. Preferably, control circuitry 84 detects disparate current flow levels $I_1$, $I_2$, within a predetermined time period from the operation of stage 1010, and responsive to the detected disparate current flow levels $I_1$, $I_2$, measured the voltage via voltage measuring means 82. In stage 1060, measured voltages $V_{PD1}$, $V_{PD2}$ of stage 1040 are transmitted from PD 70 to PSE 40. In one embodiment measured voltages $V_{PD1}$, $V_{PD2}$ are transmitted via PD to PSE communication as described in the above referenced U.S. Pat. No. 7,145,439 issued Dec. 5, 2006 to Darshan et al. In another embodiment measured voltages $V_{PD1}$, $V_{PD2}$ are transmitted are communicated via optional data path 110 to PD operating circuitry 100. PD operating circuitry 100 transmits measured voltages $V_{PD1}$, $V_{PD2}$ via a level 2 transaction to one of control circuitry 42, a host (not shown) and a master controller (not shown) as will be described further hereinto below in relation to FIG. 5.

In stage 1070, effective resistance, denoted $R_{effective}$, is determined as a function of $V_{PSE1}$, $V_{PSE2}$ of stage 1050; $V_{PD1}$, $V_{PD2}$ of stage 1040; and $I_1$, $I_2$ of stage 1030. Preferably, $I_1$, $I_2$ are measured values as described above in relation to stage 1030. In another embodiment, $I_1$, $I_2$ are nominal values as set in the manufacture of current impresser 86, 300, 350 and 370 of FIGS. 1A-1C, 3A-3C, respectively. Preferably, $R_{effective}$ is determined as described above in relation to the Eq. 1.

Thus, the method of FIG. 4 enables determination of the effective resistance between PSE 40 and PD 70 responsive to the impressing of two disparate current flow levels between PSE 40 and PD 70 and in particular between PSE 40 and PD interface 80.

Figure 5:
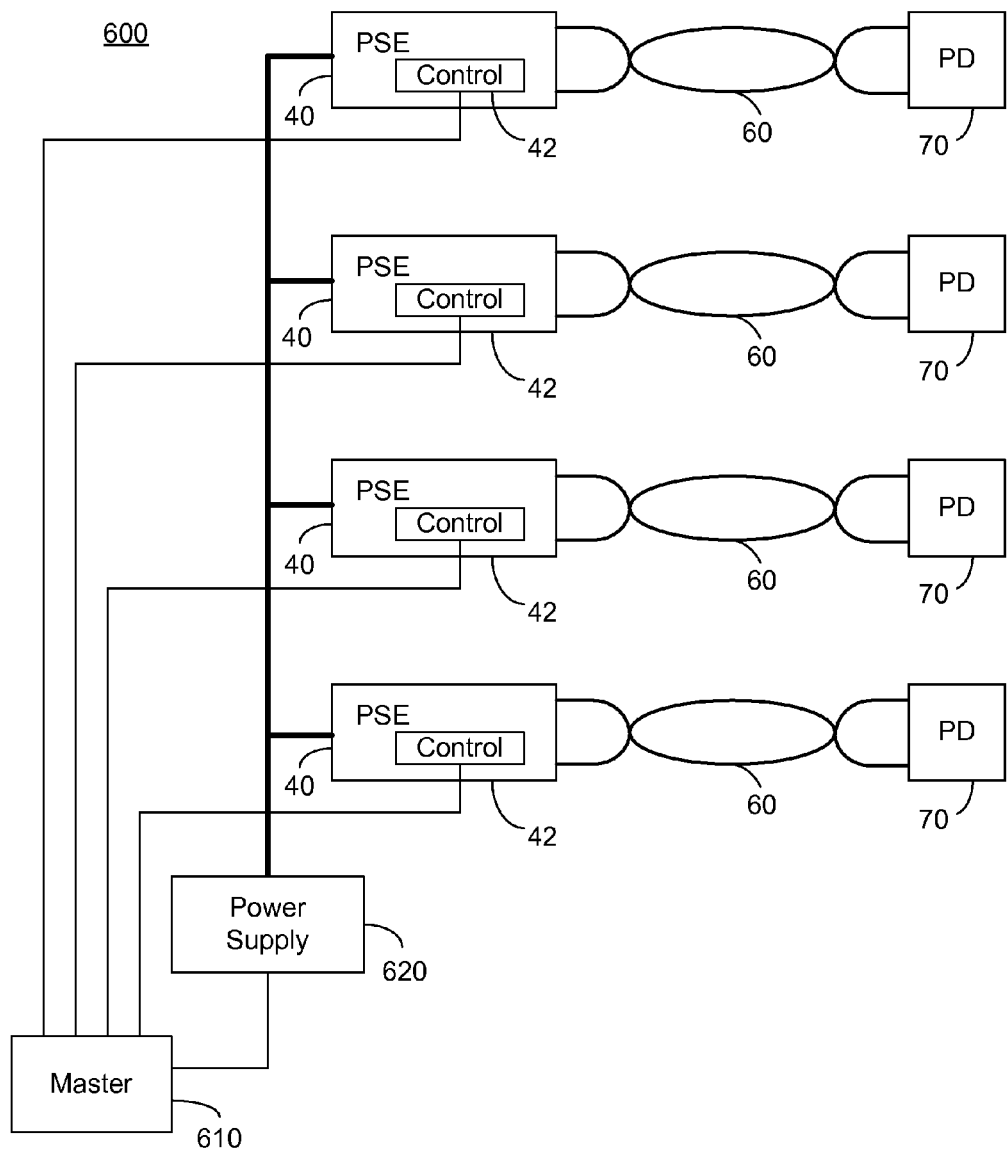
FIG. 5 illustrates a high level block diagram of a plurality of PSEs receiving power from a common source and arranged to power a plurality of PDs, the PSEs being responsive to a master controller, according to a principle of the current invention.

FIG. 5 illustrates a high level block diagram of a system 600 comprising a plurality of PSEs 40, responsive to a master controller 610, receiving power from a common power supply 620 and arranged to power a plurality of PDs 70 each over a respective communication cabling 60 according to a principle of the current invention. Each PSE 40 comprises a control circuitry 42 in communication with master controller 610.

In operation, master controller 610 of system 600 determines a total amount of power from common power supply 620 and preferably further determines the nominal output voltage. Master controller 610 further receives from each control circuitry 42 a classification of the attached PD 70 and a determination of the effective resistance between the PSE 40 and the associated PD 70, $R_{effective}$. Master controller 610 calculates the actual maximum power draw from common power supply 620 for each PD 70 responsive to the classification of PD 70 and the determined effective resistance $R_{effective}$. Preferably, the nominal output voltage is further utilized in the calculation of actual maximum power draw. In the event that sufficient power is available from common power supply 620, an additional PD 70 is powered responsive to detection. In the event that sufficient power is not available from common power supply 620, an additional PD 70 is not powered.

The effective resistance $R_{effective}$ between each PSE 40 and associated PD 70 is determined in accordance with the method of FIG. 4, described above. The determined effective resistance $R_{effective}$ is then utilized for all subsequent powering decisions. In another embodiment, effective resistance $R_{effective}$ is determined and the available power budget from common power supply 62 is updated accordingly. In yet another embodiment, power is removed from one or more PD 70 in the event insufficient power is determined responsive to determined effective resistance $R_{effective}$. Preferably in such an embodiment power is removed from ports while maintaining a predetermined priority as described further in U.S. Pat. No. 6,473,608 issued to Lehr et al referenced above.

The above has been described in relation to a plurality of PDs 70 exhibiting classification, however this is not meant to be limiting in any way. In the event that one or more PD 70 does not exhibit a classification, a default classification value is utilized. The above has been described in relation to a plurality of PSEs 40 each exhibiting classification functionality 49, however this is not meant to be limiting in any way. In the event that one or more PSEs 40 do not exhibit a classification functionality 49, a default classification value is utilized.

Figure 6:
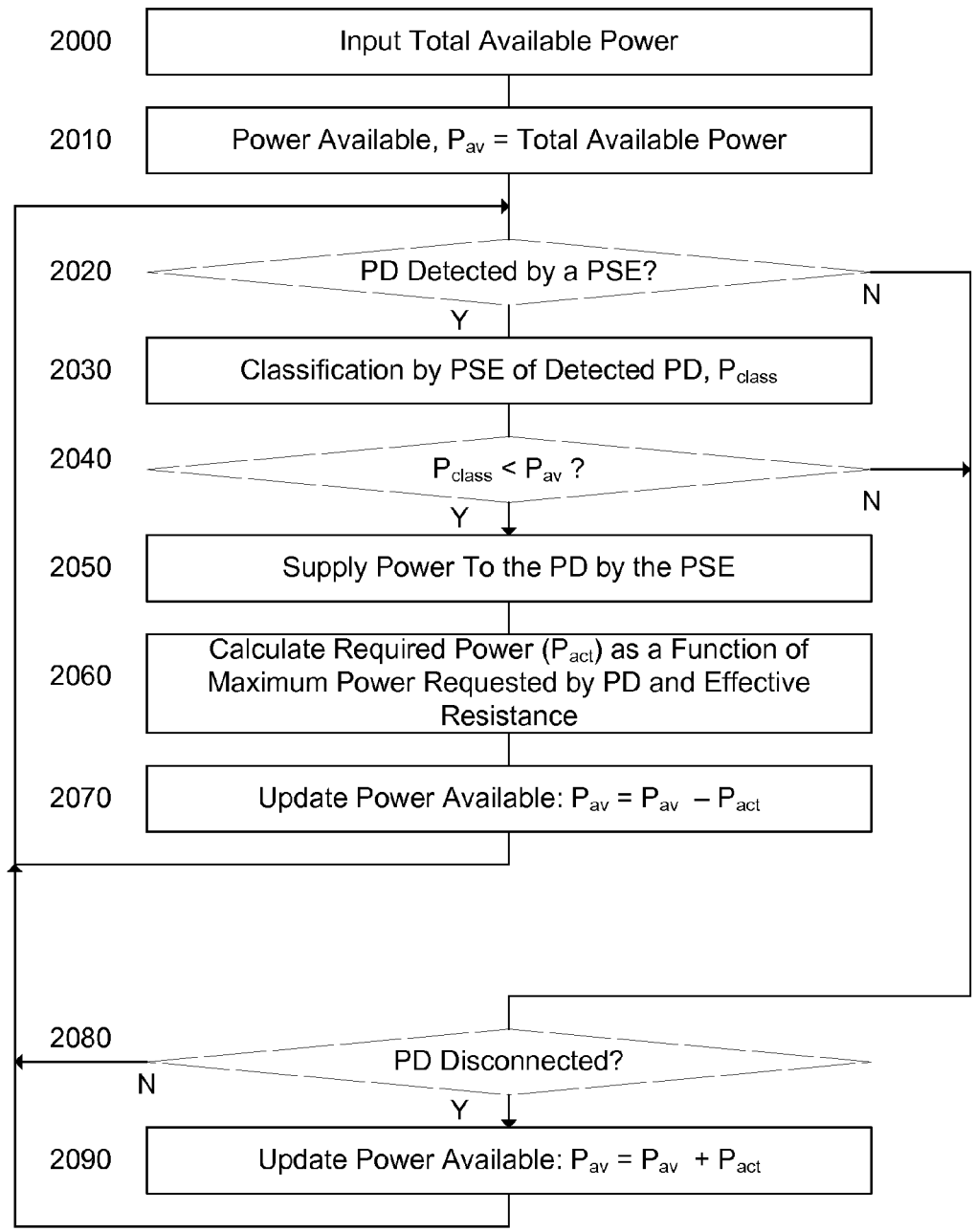
FIG. 6 illustrates a high level flow chart of the operation of the master controller of FIG. 5 to allocate power responsive to the determined effective resistance of FIG. 4 according to a principle of the current invention.

FIG. 6 illustrates a high level flow chart of the operation of the master controller of system 600 of FIG. 5 to allocate power responsive to the determined effective resistance $R_{effective}$ of FIG. 4 according to a principle of the current invention. In stage 2000, the total power available from common power supply 620 is input. Preferably the voltage output is further input. In one embodiment master controller 610 is in communication with common power supply 620, and in another embodiment the total available power is input from one of a host and a user.

In stage 2010, a variable denoted $P_{av}$ is established, and $P_{av}$ is further set to be equal to the total available power input in stage 2000. In stage 2020, PSEs 40 in communication with master controller 610 are polled to determine if any of the PSEs 40 have detected a valid PD 70.

In the event that a valid PD 70 has been detected by a PSE 40, in stage 2030, the detected PD 70 is classified to determined maximum power draw. In an embodiment in which no classification is performed, a default classification of maximum power draw is assigned. The maximum power draw is denoted $P_{class}$.

In stage 2040, the power needed to support the classification of stage 2030, in a worst case scenario, $P_{class}$, is compared with $P_{av}$, representing the power available. In the event that $P_{class}$ is less than $P_{av}$, i.e. the power needed is less than the available power, in stage 2050 power is supplied by the associated PSE 40 to the PD 70 identified and classified in stages 2020, 2030 above.

In stage 2060, the actual power, denoted PACT, needed to support the classification of stage 2030 responsive to the determined effective resistance $R_{effective}$, in accordance with the method of FIG. 5 above, is calculated. In stage 2070, the available power variable, $P_{av}$, is updated responsive to the power calculated in stage 2060 as: $P_{av}=P_{av}-P_{act}$. Thus, in stage 2070 the available power is reduced by the actual power required to support the classification of stage 2030 responsive to the determined effective resistance $R_{effective}$. Stage 2020 as described above is then performed.

In the event that in stage 2020 a valid PD 70 has not been detected by a PSE 40, or in the event that in stage 2040 $P_{class}$ is not less than $P_{av}$, i.e. the power needed is more than or equal to the available power, in stage 2080 control circuitry 42 of each PSE 40 is polled to determine if any PD 70 for which power has been allocated has been disconnected. In particular, the term disconnected is meant to include any situation in which power to the port is not to be maintained including a condition in which the port has become locally powered. In accordance with the above mentioned standard, a valid PD 70 must present one of a DC maintain power signature and an AC maintain power signature in order for power from a PSE 40 to be maintained.

In the event that in stage 2080 a port has been disconnected, in stage 2090 power available is updated to reflect the power, $P_{act}$, no longer allocated to the disconnected port as: $P_{av}=P_{av}+P_{act}$. Stage 2020 as described above is then performed. In the event that in stage 2080 a port has not been detected as disconnected, stage 2020 as described above is then performed.

The above has been described in an embodiment in which detection and disconnected are polled by master controller 610; however this is not meant to be limiting in any way. In another embodiment, master controller 610 acts responsive to interrupts from each PSE 40 indicating detection and/or disconnection.

The method of FIG. 5 thus provides powering responsive to the determined effective resistance $R_{effective}$. Advantageously, the actual maximum power to support classification is calculated and allocated, thus preventing wasted power, and enabling powering of additional detected PDs 70.

Thus the present embodiments enable a method for determining the effective resistance between the PSE and the PD, the method comprising: impressing a plurality of disparate current flow levels between the PSE and the PD prior to connecting power to PD operational circuitry; measuring the voltage at the PD interface at each of the plurality of impressed current flow levels; measuring the voltage at the PSE at each of the plurality of impressed current flow levels; and determining the effective resistance responsive to the plurality of voltage measurements at the PD, the plurality of voltage measurements at the PSE and the current flow levels.

Preferably the current flow levels are measured, and the measured current flow levels are utilized in determining the effective resistance. Preferably, the plurality of current flow levels are associated with PD-PSE communication.

Advantageously, determining the effective resistance of the cable and connections between the PSE and the PD allows for better allocation of power, since the actual power to be allocated to the PSE in order to support the PD classification power is more accurately determined.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable subcombination. In particular, the invention has been described with an identification of each powered device by a class, however this is not meant to be limiting in any way. In an alternative embodiment, all powered device are treated equally, and thus the identification of class with its associated power requirements is not required.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

In the claims of this application and in the description of the invention, except where the context requires otherwise due to express language or necessary implication, the word "comprise" or variations such as "comprises" or "comprising" is used in any inclusive sense, i.e. to specify the presence of the stated features but not to preclude the presence or addition of further features in various embodiments of the invention.

No admission is made that any reference constitutes prior art. The discussion of the reference states what their author's assert, and the applicants reserve the right to challenge the accuracy and pertinency of the cited documents. It will be clearly understood that, although a number of prior art complications are referred to herein, this reference does not constitute an admission that any of these documents forms part of the common general knowledge in the art in any country It will be appreciated by persons skilled in the art that the present invention is not limited to what has been particularly shown and described hereinabove. Rather the scope of the present invention is defined by the appended claims and includes both combinations and subcombinations of the various features described hereinabove as well as variations and modifications thereof which would occur to persons skilled in the art upon reading the foregoing description.

We claim:

1. A method of determining an effective resistance between a power sourcing equipment and a powered device, the powered device exhibiting an interface and an operational circuitry, the method comprising:
   prior to connecting power to the operational circuitry of the powered device, impressing two disparate current flow levels ($I_1$, $I_2$) between the power sourcing equipment and the powered device;
   measuring the voltage at said powered device interface ($V_{PD1}$, $V_{PD2}$) responsive to each of said impressed disparate current levels;
   measuring the voltage at said power sourcing equipment ($V_{PSE1}$, $V_{PSE2}$) responsive to each of said impressed disparate current levels; and
   determining the effective resistance between the power sourcing equipment and the powered device responsive to said $V_{PD1}$, $V_{PD2}$, $V_{PSE1}$, $V_{PSE2}$, $I_1$ and $I_2$.

2. A method according to claim 1, wherein said determining the effective resistance comprises:
   calculating the resistance as a result of: $((V_{PSE1}-V_{PSE2})-(V_{PD1}-V_{PD2}))/(I_1-I_2)$.

3. A method according to claim 2, further comprising:
   measuring the current of each of said two disparate current levels, said $I_1$, $I_2$ being said measured currents.

4. A method according to claim 1, further comprising:
   measuring the current of each of said two disparate current levels, said $I_1$, $I_2$ being said measured currents.

5. A method according to claim 1, further comprising transmitting said measured voltages at said powered device interface to the power sourcing equipment.

6. A method according to claim 5, wherein said transmitting is prior to said connecting power to operational circuitry of the powered device, said transmitting comprising further impressing two disparate flow current levels between the power sourcing equipment and the powered device.

7. A method according to claim 1, further comprising:
   sensing a voltage at the powered device interface indicative of remote powering over communication cabling,
   wherein said impressing is responsive to said sensing.

8. A method according to claim 1, further comprising:
   classifying the powered device; and
   allocating power to said powered device responsive to said determined effective resistance and said classifying.

9. A method according to claim 1, further comprising allocating power to said powered device responsive to said determined effective resistance.

10. A method according to claim 1, further comprising allocating power to said powered device, said allocating power being a function of a power requested by said powered device less power lost due to said determined effective resistance.

11. A system for determining an effective resistance between a power sourcing equipment and a powered device, the system comprising:
    a first power sourcing equipment;
    a first voltage measuring means associated with said first power sourcing equipment;
    a control circuitry responsive to said first voltage measuring means;
    a powered device, comprising a powered device interface and a powered device operational circuitry, arranged to receive power from said first power sourcing equipment;
    a second voltage measuring means associated with said powered device interface; and
    a current level impresser associated with said powered device interface,
    said powered device interface being operable responsive to said second voltage measuring means to:
      prior to connecting power to said powered device operational circuitry, via said current level impresser, impress, two disparate current flow levels ($I_1$, $I_2$) between the first power sourcing equipment and the powered device interface; and
      measure, via said second voltage measuring means, the voltage at said power device interface ($V_{PD1}$, $V_{PD2}$) responsive to said impressed two disparate current flow levels, said control circuitry being operable to:
  measure, via said first voltage measuring means, the voltage at said first power sourcing equipment ($V_{PSE1}$, $V_{PSE2}$) responsive to said impressed two disparate current levels; and
  determine the effective resistance between said first power sourcing equipment and said powered device interface responsive to said $V_{PD1}$, $P_{PD2}$, $V_{PSE1}$, $V_{PSE2}$, $I_1$ and $I_2$.

12. A system according to claim 11, wherein said determined effective resistance is a function of: $((V_{PSE1}-V_{PSE2})-(V_{PD1}-V_{PD2}))/(I_1-I_2)$.

13. A system according to claim 11, further comprising a current measuring means, said $I_1$, $I_2$ being determined by said current measuring means.

14. A system according to claim 11, wherein said powered device interface further comprises a transmitter, said current level impresser being associated with said transmitter.

15. A system according to claim 14, wherein said powered device interface is further operable to transmit said measured voltages, via said transmitter, to said power sourcing equipment.

16. A system according to claim 11, wherein said current level impresser comprises one of a variable current source, a variable impedance, a switched impedance and a controllable current source.

17. A system according to claim 11, wherein said powered device interface is further operable to transmit said measured voltages to said power sourcing equipment.

18. A system according to claim 11, wherein said powered device interface is further operable to transmit said measured voltages to said control circuitry.

19. A system according to claim 11, further comprising:
  a data path between said powered device interface and said powered device operational circuitry,
  said powered device interface being further operable to communicate said measured $V_{PD1}$, $V_{PD2}$ to said power device operational circuitry.

20. A system according to claim 19, wherein said powered device operational circuitry is further operable to transmit said communicated $V_{PD1}$, $V_{PD2}$ to said control circuitry.

21. A system according to claim 11, wherein said control circuitry further comprises a classification functionality operable to determine a requested power from said powered device interface.

22. A system according to claim 21, further comprising:
  a master controller; and
  at least one second power sourcing equipment,
  each of said at least one second power sourcing equipment comprising a control circuitry, each of said control circuitry being responsive to said master controller.

23. A system according to claim 22, wherein said master controller is operable to allocate power to said first powered device responsive to said determined effective resistance and said determined requested power.

24. A system according to claim 11 further comprising:
  a communication cabling connecting said first power sourcing equipment and said powered device,
  wherein said powered device arranged to receive power from said first power sourcing equipment receives said power via said communication cabling.

25. A system according to claim 11, wherein said powered device interface is further operable to:
  sense a voltage, via said second voltage measuring means, of remote powering from said first power sourcing equipment,
  wherein said impressed two disparate current flow levels is responsive to said sensed voltage.

26. A system according to claim 11, wherein said powered device further comprises an isolating switch responsive to said powered device interface, said isolating switch being arranged to switchably connect power to said powered device operational circuitry responsive to said powered device interface.

27. A powered device interface operable in cooperation with a power sourcing equipment to determine an effective resistance there between, the powered device interface comprising:
  a control circuitry;
  a voltage measuring means in communication with said control circuitry;
  a current level impresser responsive to said control circuitry; and
  an isolating switch control means responsive to said control circuitry,
  said control circuitry being operable to:
    impress, via said current level impresser, two disparate current flow levels ($I_1$, $I_2$);
    measure, via said second voltage measuring means, the voltage at said powered device interface responsive to said impressed two disparate current flow levels; and
    subsequent to said sourcing two disparate current flow levels, operate said isolating switch control means to connect power to associated powered device operational circuitry.

28. A powered device interface according to claim 27, wherein said control circuitry is further operable to transmit said measured voltages.

29. A powered device interface according to claim 27, further comprising a transmitter responsive to said control circuitry, said control circuitry being operable to transmit said measured voltages, via said transmitter, to the power sourcing equipment.

30. A powered device interface according to claim 29, wherein said current level impresser is associated with said transmitter.

31. A powered device interface according to claim 27, wherein said current level impresser comprises one of a variable current source, a variable impedance, a switched impedance and a controllable current source.

32. A powered device operable in cooperation with a power sourcing equipment to determine an effective resistance there between, the powered device comprising:
  a powered device interface;
  a powered device operational circuitry;
  a voltage measuring means associated with said powered device interface;
  a current level impresser associated with said powered device interface; and
  an isolating switch responsive to said powered device interface,
  said powered device interface being operable to:
    to impress via said current level impresser, prior to connecting power to said powered device operational circuitry via said isolating switch, two disparate current flow levels ($I_1$, $I_2$); and
    measure, via said second voltage measuring means, voltages at said powered device interface responsive to said impressed two disparate current flow levels.

33. A powered device according to claim 32, wherein said powered device interface is further operable to transmit said measured voltages.

34. A powered device according to claim 32, further comprising a transmitter associated with said powered interface, said powered device interface being operable to transmit said measured voltages via said transmitter, to the power sourcing equipment.

35. A powered device according to claim 34, wherein said current level impresser is associated with said transmitter.

36. A powered device according to claim 33, wherein said current level impresser comprises one of a variable current source, a variable impedance, a switched impedance and a controllable current source.

37. A powered device according to claim 33, further comprising a data path between said powered device interface and said powered device operational circuitry, said powered device interface being further operable to communicate said measured $V_{PD1}$, $V_{PD2}$ to said power device operational circuitry.

38. A powered device according to claim 37, wherein said power device operational circuitry is operable to transmit said communicated $V_{PD1}$, $V_{PD2}$.

39. A power sourcing equipment operable to determine an effective resistance between the power sourcing equipment and a powered device connected thereto, comprising:

a control circuitry;

a voltage measuring means arranged to measure a port voltage of the power sourcing equipment and in communication with said control circuitry; and a current measuring means arranged to measure a current flowing between the power sourcing equipment via the port and the powered device, said control circuitry being operable to:

supply an operating voltage to the powered device via the port;

detect, via the current measuring means two disparate current flow levels ($I_1$, $I_2$) between the power sourcing equipment via the port and the powered device responsive to the supplied operating voltage;

receive an indication of the voltage at the powered device ($V_{PD1}$, $V_{PD2}$) responsive to said two disparate current flow levels;

measure, via said voltage measuring means, the port voltage of the power sourcing equipment ($V_{PSE1}$, $V_{PSE2}$) responsive to said detected two disparate current levels; and determine the effective resistance between the power sourcing equipment and the powered device responsive to $V_{PD1}$, $V_{PD2}$, $V_{PSE1}$, $V_{PSE2}$, $I_1$ and $I_2$.

* * * * *